United States Patent
Laumann

(10) Patent No.: US 6,763,577 B1
(45) Date of Patent: Jul. 20, 2004

(54) SYSTEM FOR PLACING ELECTRONIC COMPONENTS ON CIRCUIT CARRIERS

(75) Inventor: Rolf Laumann, Altenbeken (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/069,205

(22) PCT Filed: Aug. 22, 2000

(86) PCT No.: PCT/DE00/02857

§ 371 (c)(1),
(2), (4) Date: Feb. 22, 2002

(87) PCT Pub. No.: WO01/17328

PCT Pub. Date: Mar. 8, 2001

(30) Foreign Application Priority Data

Aug. 26, 1999 (DE) .......................... 199 40 584

(51) Int. Cl.⁷ .......................... H05K 3/30; B07C 5/344
(52) U.S. Cl. .......................... 29/832; 29/825; 29/701; 29/729; 29/720; 209/571
(58) Field of Search .......................... 29/825, 832, 833, 29/840, 701, 729, 720, 564; 235/375; 209/571, 573, 574

(56) References Cited

U.S. PATENT DOCUMENTS

| | | | | |
|---|---|---|---|---|
| 4,630,216 A | * | 12/1986 | Tyler et al. .......... | 700/229 |
| 4,667,403 A | * | 5/1987 | Edinger et al. ....... | 29/840 |
| 4,870,590 A | * | 9/1989 | Kawata et al. ....... | 700/115 |
| 5,235,164 A | * | 8/1993 | Noyama et al. ...... | 235/375 |
| 5,325,582 A | * | 7/1994 | Glaser et al. ........ | 29/840 |
| 5,386,364 A | * | 1/1995 | Tyler .................. | 701/23 |
| 5,740,604 A | | 4/1998 | Kitamura et al. | |
| 5,974,565 A | * | 10/1999 | Okuhara et al. ...... | 714/11 |

FOREIGN PATENT DOCUMENTS

| | | |
|---|---|---|
| JP | 02202100 A | 8/1990 |
| JP | 06006098 A | 1/1994 |
| JP | 06061685 A | 3/1994 |
| WO | WO9913428 | 9/1998 |

\* cited by examiner

Primary Examiner—Carl J. Arbes
Assistant Examiner—Tai Nguyen
(74) Attorney, Agent, or Firm—Baker Botts LLP

(57) ABSTRACT

The invention relates to a system for placing electronic components maintained in an array to feed tracks (2) of a placement unit (1) wherein, the correct placement of the array is accomplished in a feed supervisory unit (4) by comparison of component-related data stored on identification carriers (9) respectively assigned to the arrays with placement-related data stored on a portable equipment supervisory carrier (8).

7 Claims, 2 Drawing Sheets

SYSTEM FOR PLACING ELECTRONIC COMPONENTS ON CIRCUIT CARRIERS

FIELD OF THE INVENTION

The invention relates to a method for placing electronic components, in particular SMD components, on circuit carriers arranged in a placement unit, within the placement-related data being stored in a control computer unit which controls the placement units. Furthermore, the invention relates to a system for placing electronic components on circuit carriers arranged in a placement unit, having a control computer unit for controlling the placement units.

BACKGROUND OF THE INVENTION

It is known, for populating circuit carriers, to provide a placement unit which automatically positions and contact-connects a plurality of electronic components, fed to said placement unit, according to a predetermined specification on the circuit carrier. The electronic components, which are maintained in the form of an array, are usually fed continuously to the placement unit. A control computer unit is provided for controlling the placement unit, which supplies placement-related data and by means of which the placement operation can be performed automatically.

The placement unit has a plurality of feed tracks to each of which a predetermined array is assigned. The array is assigned to the respective feed tracks manually during the equipment operation, with an operator reading a feed table. The erroneous assignment of an array to a feed track can occur on account of inattentiveness of the operator.

SUMMARY OF THE INVENTION

It is an object of the present invention to provide a method and a system for populating circuit carriers arranged in a placement unit which ensure secure and reliable assignment of the array to a predetermined feed track of the placement unit.

In order to achieve this object, equipment-related data are extracted from the placement-related data and transmitted to a portable equipment supervisory carrier which is coupled to a feed supervisory unit assigned to the placement unit. The electronic components are fed to the placement unit only when they are assigned to a feed track of the placement unit, the feed track being identified by the equipment-related data. A feed supervisory unit is provided in each case in the region of the feed to the placement unit. The supervisory unit has a control unit and a plurality of readers for reading component-related data stored on an identification carrier, and for reading equipment-related data stored on a portable equipment supervisory carrier. Means are provided such that equipment-related data can be derived from placement-related data present in electronic form in the control computer unit, which equipment-related data are written to the equipment supervisory carrier.

A particular advantage of the method according to the present invention is that supervisory data can be generated in a simple manner by the extraction of equipment-related data from the placement-related data present. The supervisory data can be used to check reliably and securely the assignment of arrays that are to be assigned to the respective feed tracks of the placement unit during an equipment operation. The equipment-related data are present in electronic form in a feed supervisory unit in which correct assignment of the array to the feed tracks is checked.

According to one preferred embodiment of the method according to the present invention, an enable signal is generated in the feed supervisory unit when the array is correctly assigned to the feed tracks. Placement can be effected only after the enable signal has been output. Consequently, the placement operation can be activated only after the checking of all arrays assigned to a placement unit. Erroneous population of the circuit carrier can thus be reliably avoided.

According to a further embodiment of the invention, the enable signal is generated only when there is an electrical connection between an equipment supervisory carrier, which characterizes a specific assignment of arrays, and the feed supervisory unit. The equipment-related data are advantageously stored exclusively on the equipment supervisory carrier, so that the current equipment-related data can be exclusively used for the supervision of the assignment. This eliminates the situation where incorrect equipment-related data used from previous equipment operations are used.

The system according to the present invention ensures the secure and reliable checking of the assignment of the array to predetermined feed tracks of the placement unit. Thus, the basic concept of the invention is to store the component-related data which characterize the array in an identification carrier, preferably connected to the array, and the equipment-related data which identify the predetermined assignment of the array to the feed tracks of the placement unit in an equipment supervisory carrier. By comparing the equipment-related data and the component-related data in a feed supervisory unit, the assignment can be checked electronically in a simple manner and, if appropriate, correction of the assignment can be signaled. The equipment-related data can advantageously be derived from the placement-related data available to a control computer unit. The access supervisory unit, which is preferably arranged in direct proximity to the placement unit, can be operated automatically and independently of the control computer unit.

By virtue of the fact that the equipment supervisory carrier is designed to be portable, the equipment-related data, once stored, can be fed to the access supervisory unit in a manner that allows them to be handled simply. The system is thus capable of being flexibly configured. There is no need for a data connection between the control computer unit and the access supervisory unit.

According to a further preferred embodiment of the system according to the present invention, the control computer unit is directly connected to a read/write device, so that after the equipment-related data have been generated, they can be stored directly on the portable equipment supervisory carrier. This enables fast and simple provision of the equipment-related data on the equipment supervisory carrier.

According to another preferred embodiment, the control computer unit is connected via a data line to a separate computer unit to which the equipment-related data are transmitted. This computer unit may be a commercially available personal computer equipped with a read/write device. This makes it possible to utilize an existing data network in order to write the equipment-related data to the equipment supervisory carrier at any desired location.

According to yet another embodiment of the present invention, a component computer unit may be provided which has a component database. This makes it possible not only for the actual component identifier of the electronic components arranged on the respective array to be stored electronically on the identification carrier, but for further information which characterizes the components to be additionally stored on the identification carrier. Consequently, the identification carrier contains component-related data which enable an operator at any time—by means of a portable reader—to identify the components combined on the array.

In another embodiment of the invention, the identification carrier and/or the equipment supervisory carrier are designed as a smart card, which have an electronic memory. In an advantageous manner, the corresponding data can be simply written or read from commercially available read/write devices.

BRIEF DESCRIPTION OF THE DRAWINGS

The invention is explained in greater detail below with reference to the drawings, in which.

DETAILED DESCRIPTION OF THE INVENTION

Figure 1:
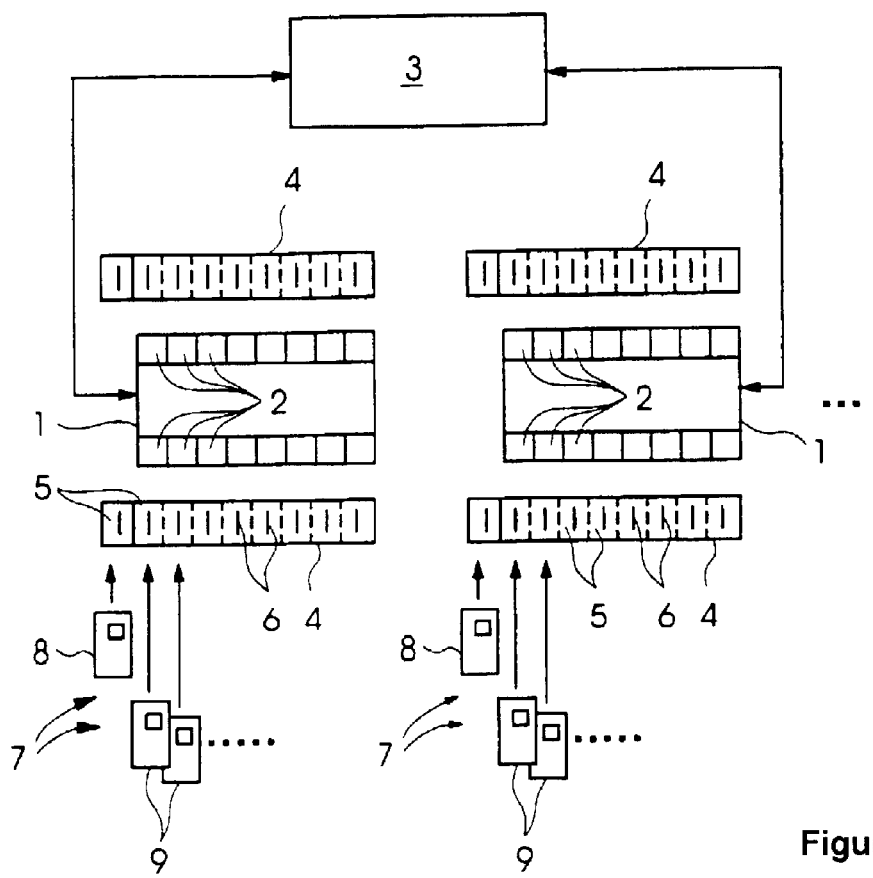
FIG. 1 illustrates a block diagram of a system according to the invention.

The system according to the invention essentially comprises a plurality of placement units 1 arranged one after the other in a production line. Electronic components are fed to the placement units on opposite sides via a plurality of feed tracks 2. The electronic components are preferably SMD components which are positioned and contact-connected in the placement unit 1 on a circuit carrier (not illustrated). A control computer unit 3 is provided for controlling the placement operation. This unit is assigned to a plurality of placement units and prescribes the placement sequence according to which the individual placement units 1 automatically perform the placement.

The row of feed tracks 2 which is arranged on one side of the placement unit 1 is respectively assigned a feed supervisory unit 4, which has a control unit, (not illustrated) and which is preferably designed as a microcontroller, and a plurality of card readers 5 with insertion slots 6 for inserting smart cards 7. The control unit of the feed supervisory unit 4 is electrically connected to the card readers 5. The smart cards 7 each have an electronic memory, preferably EEPROM memory. As an alternative, the smart card may also be designed as a microprocessor card.

The feed supervisory unit 4 is in each case assigned a single smart card 7 as equipment supervisory carrier 8, and a number of smart cards 7 corresponding to the number of feed tracks 2 as identification carrier 9. The equipment supervisory carrier 8 has the equipment-related data which are necessary for the equipment operation. The equipment-related data comprise the information about the respective equipment, the production line, the identification of the placement unit 1, the side of the placement unit 1 at which the components are to be fed, and the occupancy of the individual feed tracks 2 through allocation of the corresponding feed track 2 with a component-identifier.

The identification carrier 9 has the component identifier and further information which identifies the components situated on the array. After the identification carriers 9 have been inserted into the respective card readers 5, the component-related data are read out, and in the control unit of the feed supervisory unit 4 checked for correspondence with the predetermined equipment-related data which are taken from the equipment supervisory carriers 8 by a spatially separate card reader 5. If the occupancy of the feed tracks 2 which is prescribed by the equipment supervisory carrier 8 corresponds to the corresponding component-related data assigned to the respective feed tracks 2, the assignment of the array, which is preferably detachably connected to the respective identification carrier 9, is correct. The placement operation is then activated by the outputting of an enable signal. An incorrect occupancy of the feed tracks 2 with arrays is reliably avoided in this way.

Figure 2:
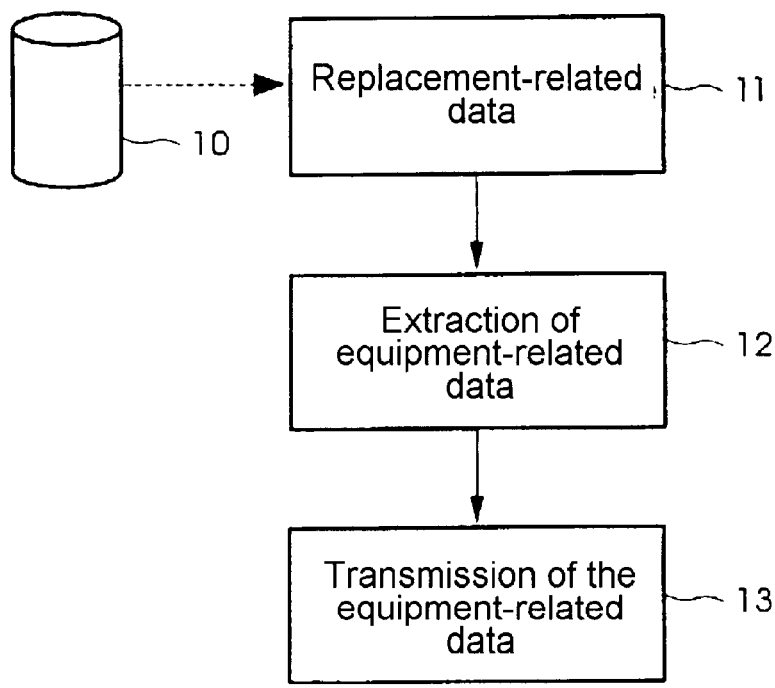
FIG. 2 illustrates a flow diagram for the generation of the equipment-related data which are stored on an equipment supervisory carrier.

The equipment-related data are generated in the manner illustrated in accordance with FIG. 2. In step 11, placement-related data, comprising all control data relevant to the placement operation, are read from a database 10 of the control computer unit 3. In step 12, the equipment-related data are extracted from the placement-related data and transmitted in a step 13 to the equipment supervisory carrier 8 by means of a read/write device (not illustrated). According to a preferred embodiment, this sequence may proceed in an integrated manner in the control computer unit 3, designed as a UNIX computer architecture. In another exemplary embodiment, the sequence can also be effected in a commercially available personal computer (not illustrated) which is locally separate from the control computer unit 3, but which is connected to the latter by means of a data connection.

Figure 3:
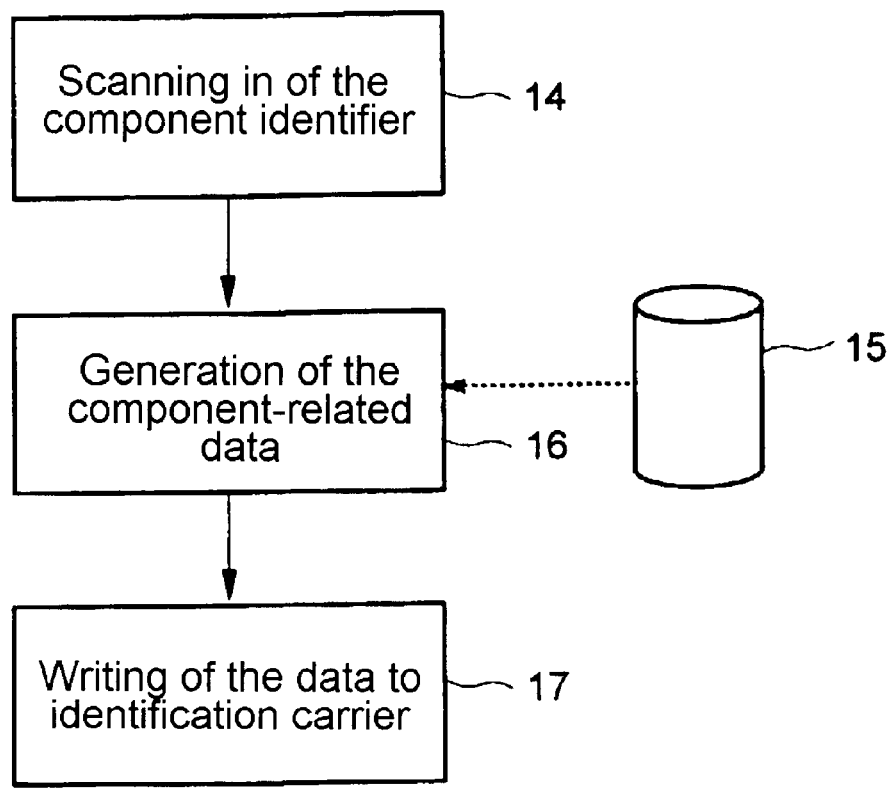
FIG. 3 illustrates a flow diagram for the generation of component-related data.

In order to generate the component-related data in the identification carriers 9, according to an exemplary embodiment shown in FIG. 3, the component identifier is present as a bar code on the array which is read into a personal computer (not illustrated) by means of a manual scanner, step 14. By retrieving extended component-related data such as, for example, the designation of the component, the design, etc. from a database 15, it is possible to generate extended component-related data. See step 16. These component-related data can then be written to the identification carrier 9 by means of a read/write device, step 17. The identification carrier 9 then contains information which identifies the content or the state of an array. This information can be retrieved at any time in a simple manner by means of a mobile manual reader.

By way of example, provision may be made for storing in the identification carrier 9 details concerning the number of components arranged on the array. The current number of components on the array can thus be visualized at any time after repeated use of the array. A prerequisite for this is that the number of components used is written to the corresponding identification carrier 9 after the placement operation.

What is claimed is:

1. A system for placing electronic components on circuit carriers arranged in a placement unit having a control computer unit for controlling the placement units, comprising a feed supervisory unit located in the region of a feed to the placement unit said supervisory unit having a control unit and a plurality of readers for reading component-related data stored on an identification carrier, and for reading equipment-related data stored on an equipment supervisory carrier, further comprising means for deriving equipment-related data from placement-related data present in electronic form in the control computer unit, which equipment-related data are written to the equipment supervisory carrier.

2. The system according to claim 1, wherein the control computer unit is connected to a read/write device so that the equipment-related data can be written directly to the equipment supervisory carrier.

3. The system according to claim 1, wherein the control computer unit is connected to a separate computer unit via a data line for transmitting the equipment-related data to the computer unit, which further is connected to a read/write device for writing the equipment-related data to the equipment supervisory carrier.

4. The system according to claim 1, wherein the placement-related data are stored at least in a database of the control computer unit.

5. The system according to claim 1, further comprising a database for storing information which identifies the components, and from which component-related data assigned to an array can be generated, and further wherein relevant component-related data can be written to the identification carrier assigned to a corresponding array.

6. The system according to claim 5, further comprising a bar code component identifier on the array and, a bar code reader linked with the component-related data present in the database so that the component identifier is automatically extended by the further equipment-related data.

7. The system according to claim 1, wherein the equipment supervisory carrier and/or the identification carrier are designed as a smart card.

* * * * *